US011925125B2

(12) United States Patent
Kardasz et al.

(10) Patent No.: US 11,925,125 B2
(45) Date of Patent: Mar. 5, 2024

(54) HIGH RETENTION STORAGE LAYER USING ULTRA-LOW RA MgO PROCESS IN PERPENDICULAR MAGNETIC TUNNEL JUNCTIONS FOR MRAM DEVICES

(71) Applicant: Integrated Silicon Solution, (Cayman) Inc., Grand Cayman (KY)

(72) Inventors: Bartlomiej Adam Kardasz, Pleasanton, CA (US); Jorge Vasquez, San Jose, CA (US); Mustafa Pinarbasi, Morgan Hill, CA (US); Georg Wolf, San Francisco, CA (US)

(73) Assignee: Integrated Silicon Solution, (Cayman) Inc., Grand Cayman (KY)

( * ) Notice: Subject to any disclaimer, the term of this patent is extended or adjusted under 35 U.S.C. 154(b) by 43 days.

(21) Appl. No.: 17/581,950

(22) Filed: Jan. 23, 2022

(65) Prior Publication Data

US 2022/0149267 A1 May 12, 2022

Related U.S. Application Data

(63) Continuation of application No. 15/859,458, filed on Dec. 30, 2017, now Pat. No. 11,264,557.

(51) Int. Cl.
| | |
|---|---|
| *H10N 50/80* | (2023.01) |
| *G11C 11/16* | (2006.01) |
| *H01F 10/32* | (2006.01) |
| *H01F 41/30* | (2006.01) |
| *H10B 61/00* | (2023.01) |
| *H10N 50/01* | (2023.01) |
| *H10N 50/10* | (2023.01) |

(52) U.S. Cl.
CPC ........... *H10N 50/80* (2023.02); *G11C 11/161* (2013.01); *H01F 10/3286* (2013.01); *H01F 41/307* (2013.01); *H10B 61/00* (2023.02); *H10N 50/01* (2023.02); *H10N 50/10* (2023.02); *H01F 10/3272* (2013.01); *H01F 10/329* (2013.01)

(58) Field of Classification Search
CPC ........... H01L 21/02172; H01F 10/3272; H01F 10/329
See application file for complete search history.

(56) References Cited

U.S. PATENT DOCUMENTS

| | | |
|---|---|---|
| 6,841,395 B2 | 1/2005 | Linn et al. |
| 2007/0111332 A1 | 5/2007 | Zhao et al. |
| 2007/0148786 A1 | 6/2007 | Horng et al. |
| 2009/0268351 A1* | 10/2009 | Zeltser ................. H01F 41/307 204/192.15 |
| 2013/0163314 A1 | 6/2013 | Yamane et al. |
| 2015/0061050 A1 | 3/2015 | Zhou et al. |
| 2016/0087193 A1 | 3/2016 | Pinarbasi et al. |
| 2016/0315249 A1* | 10/2016 | Kardasz ................. H10N 50/10 |
| 2019/0189910 A1 | 6/2019 | Patel et al. |

\* cited by examiner

Primary Examiner — Tuan A Hoang

(57) ABSTRACT

The disclosure provides a magnetic random access memory element. The magnetic random access memory element includes a magnetic reference layer, a magnetic free layer, and a non-magnetic barrier layer between the magnetic free layer and the magnetic reference layer. The magnetic random access memory element further includes a MgO layer contacting the magnetic free layer. The MgO layer includes multiple homogeneous layers of MgO that provide excellent interfacial perpendicular magnetic anisotropy to the magnetic free layer while also having a low RA.

18 Claims, 3 Drawing Sheets

HIGH RETENTION STORAGE LAYER USING ULTRA-LOW RA MgO PROCESS IN PERPENDICULAR MAGNETIC TUNNEL JUNCTIONS FOR MRAM DEVICES

CROSS-REFERENCE TO RELATED APPLICATION

This application is a continuation of U.S. patent application Ser. No. 15/859,458, entitled HIGH RETENTION STORAGE LAYER USING ULTRA-LOW RA MgO PROCESS IN PERPENDICULAR MAGNETIC TUNNEL JUNCTIONS FOR MRAM DEVICES, filed on Dec. 30, 2017, now U.S. Pat. No. 11,264,557, issued Mar. 1, 2022,k which is incorporated herein by reference for all purposes.

FIELD OF THE INVENTION

The present invention relates to magnetic random access memory (MRAM), and more particularly to a method for manufacturing a magnetic random access memory with a capping layer for providing improved free layer magnetic retention and reduced area resistance.

BACKGROUND

Magnetic Random Access Memory (MRAM) is a non-volatile data memory technology that stores data in magnetoresistive cells, such as Magnetoresistive Tunnel Junction (MTJ) elements. At their most basic level, such MTJ elements include first and second magnetic layers that are separated by a thin, non-magnetic tunnel barrier layer, which may be constructed of an insulating barrier material, such as MgO, $Al_2O_3$, etc. The first magnetic layer, which may be referred to as a reference layer, has a magnetization that is fixed in a direction that is perpendicular to that of a plane of the layer. The second magnetic layer has a magnetization that is free to move so that it may be oriented in either of two directions that are both generally perpendicular to the plane of the reference magnetic layer. Therefore, the magnetization of the free layer may be either parallel with the magnetization of the reference layer or anti-parallel with the direction of the reference layer (i.e., opposite to the direction of the reference layer).

The electrical resistance through the MTJ element in a direction perpendicular to the planes of the layers changes with the relative orientations of the magnetizations of the magnetic reference layer and magnetic free layer. When the magnetization of the magnetic free layer is oriented in the same direction as the magnetization of the magnetic reference layer, the electrical resistance through the MTJ element is at its lowest electrical resistance state. Conversely, when the magnetization of the magnetic free layer is in a direction that is opposite to that of the magnetic reference layer, the electrical resistance across the MTJ element is at its highest electrical resistance state.

The switching of the MTJ element between high and low resistance states results from electron spin transfer. Each electron has a spin orientation. Generally, electrons flowing through a conductive material have random spin orientations with no net spin orientation. However, when electrons flow through a magnetized layer, the spin orientations of the electrons become aligned so that there is a net aligned orientation of electrons flowing through the magnetic layer, and the orientation of this alignment is dependent on the orientation of the magnetization of the magnetic layer through which they travel. When the orientation of the magnetization of the free layer and the reference layer are in the same direction, the spins of the electrons in the free layer are generally in the same direction as the orientation of the spin of the electrons in the reference layer. Because these electron spins are generally in the same direction, the electrons may pass relatively easily through the tunnel barrier layer. However, if the orientations of the magnetizations of the free layer and the reference layer are opposite to one another, the spin of electrons in the free layer will generally be opposite to the spin of electrons in the reference layer. In this case, electrons do not easily pass through the barrier layer, resulting in a higher electrical resistance through the MTJ stack.

Because the MTJ element may be switched between low and high electrical resistance states, it may be used as a memory element to store data. For example, the low resistance state may be read as a "1" or one, whereas the high resistance state may be read as a "0" or zero. In addition, because the magnetic orientation of the magnetic free layer remains in its switched state without any electrical power being provided to the element, the memory storage provided by the MTJ element is robust and non-volatile.

To write a bit of data to the MTJ cell, the magnetic orientation of the magnetic free layer is switched from a first direction to a second direction that is 180° from the first direction. This may be accomplished, for example, by applying a current through the MTJ element in a direction that is perpendicular to the planes of the layers of the MTJ element. An electrical current applied in one direction will switch the magnetization of the free layer to a first orientation, whereas an electrical current applied in a second direction will switch the magnetic of the free layer to a second, opposite orientation.

Once the magnetization of the free layer has been switched by the current, the state of the MTJ element may be read by detecting a voltage across the MTJ element, thereby determining whether the MTJ element is in a "1" or "0" bit state. Advantageously, once the switching electrical current has been removed, the magnetic state of the free layer will remain in the switched orientation until some other time when an electrical current is applied to switch the MTJ element to the opposite state. Therefore, the recorded data bit is non-volatile in that it remains intact (the magnetic orientation of the free layer does not change) in the absence of any electrical current being supplied.

SUMMARY

The present invention provides a magnetic random access memory element that includes a magnetic reference layer structure, a magnetic free layer structure, and a non-magnetic barrier layer structure located between the magnetic free layer structure and the magnetic reference layer structure. In addition, the magnetic random access memory element includes a MgO layer that contacts the magnetic free layer, the MgO layer being a multi-layer structure having an area resistance of not greater than 1.5 $\Omega\mu m^2$.

The MgO layer is deposited in a sputtering deposition chamber with a Mg target using DC power. The deposition can be performed in a series of steps of depositing Mg layers and introducing oxygen into the chamber to oxidize the deposited Mg. This results in a multilayer MgO structure that has a low resistance per unit area RA, but which also provides advantageous high interfacial perpendicular magnetic anisotropy to the magnetic free layer for increased retention. Several parameters can be controlled to maintain a RA of the MgO to no greater than 1.5 $\Omega\mu^2$. These are: deposition time; oxygen flow rate; Mg thickness and number of multilayers.

These and other features and advantages of the invention will be apparent to one of skill in the art upon reading of the following detailed description of the embodiments in conjunction with the figures. In the figures, like reference numerals used in more than one figure indicate a like element, and may be considered in light of the description of the like element presented in any of the other figures having the like element.

BRIEF DESCRIPTION OF THE DRAWINGS

For a fuller understanding of the nature and advantages of this invention, as well as the preferred mode of use, reference should be made to the following detailed description read in conjunction with the accompanying drawings. The drawings are not presented to scale unless specified otherwise on an individual basis.

DETAILED DESCRIPTION

The following description includes the best embodiments presently contemplated for carrying out the invention. This description is made for the purpose of illustrating the general principles of this invention and is not meant to limit the inventive concepts claimed herein in any way.

Figure 1:
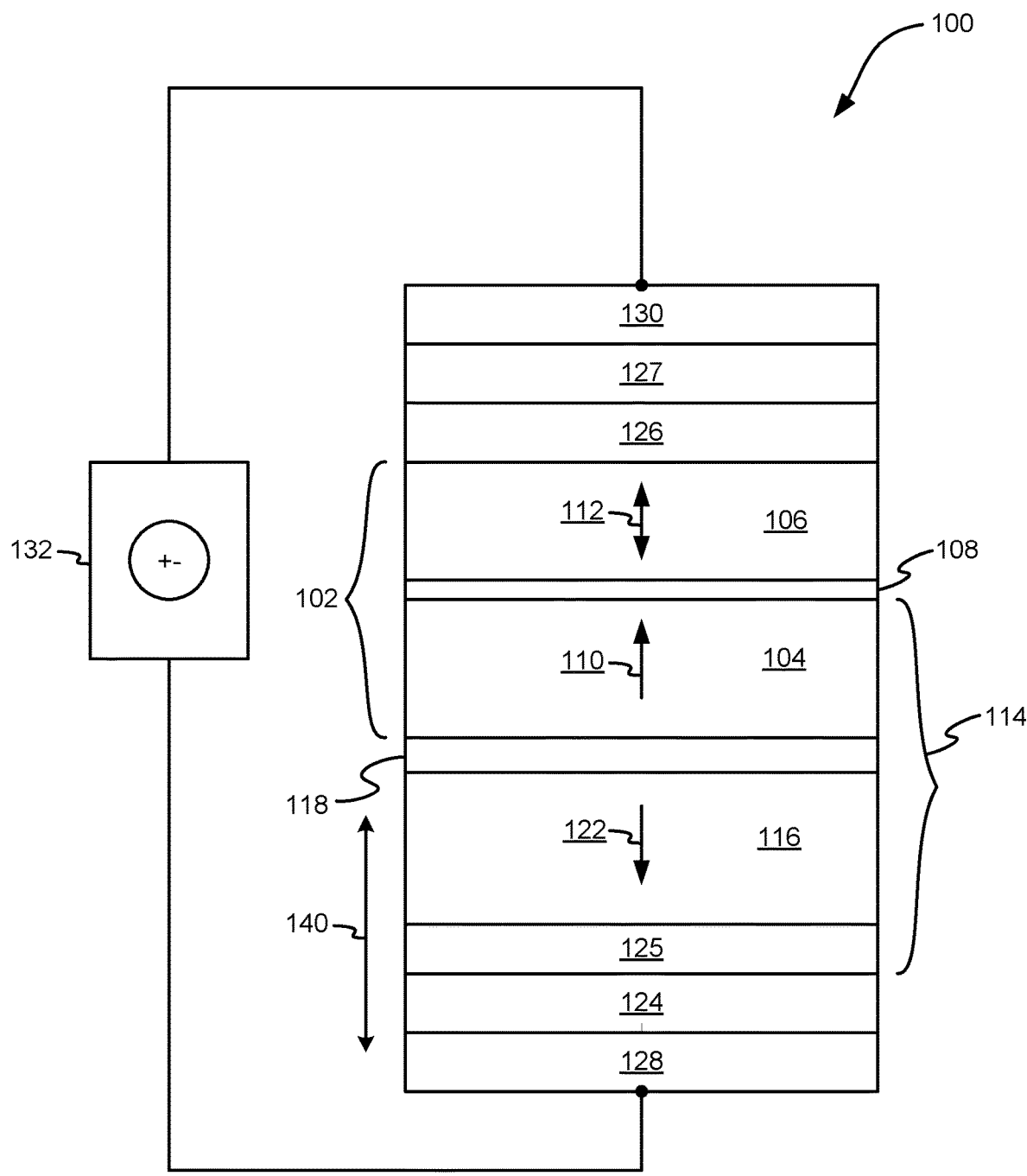
FIG. 1 is a schematic, cross-sectional view of a portion of a magnetic memory element, according to an embodiment.

Referring to FIG. 1, a magnetic memory element 100 is shown according to one embodiment. The memory element 100 may be used in a perpendicular magnetic tunnel junction (pMTJ) memory element, as described in various embodiments herein. The memory element 100 may include a magnetic tunnel junction (MTJ) 102 that may include a magnetic reference layer 104, a magnetic free layer 106, and a thin, non-magnetic, electrically-insulating magnetic barrier layer 108 positioned between the reference layer 104 and the free layer 106 in an element height direction 140. The barrier layer 108 may include an oxide, such as MgO, $Al_2O_3$, etc., or some other suitable material known in the art. The reference layer 104 has a magnetization 110 that is fixed in a direction that is perpendicular to a horizontal plane of the layer, as indicated by the arrow. The horizontal plane is sometimes referred to as a plane of formation in the embodiments described herein. The free layer 106 has a magnetization 112 that may be in either of two directions perpendicular to a horizontal plane of the free layer 106, as indicated by the two arrows. While the magnetization 112 of the free layer 106 remains in either of two directions perpendicular to the plane of the free layer 106 in a quiescent state, it may be selectable switched between these two directions, as is described in greater detail herein. When the magnetization 112 of the free layer 106 is in the same direction as the magnetization 110 of the reference layer 104, the electrical resistance across the MTJ 102 is at a low resistance state. Conversely, when the magnetization 112 of the free layer 106 is opposite to the magnetization 110 of the reference layer 104, the electrical resistance across the MTJ 102 is in a high resistance state.

The reference layer 104 may be part of an anti-parallel magnetic pinning structure 114 that may include a magnetic pinning layer 116 and a non-magnetic, antiferromagnetic coupling layer 118 positioned between the pinning layer 116 and the reference layer 104 in the element height direction 140. The antiferromagnetic coupling layer 118 may comprise any suitable material known in the art, such as Ru, Ir, Cr and may be constructed to have a thickness that causes ferromagnetic antiparallel (antiferromagnetic) coupling of the pinning layer 116 and the reference layer 104. The antiferromagnetic coupling between the pinning layer 116 and the reference layer 104 pins the magnetization 110 of the reference layer 104 in a second direction opposite to the direction of magnetization 122 of the pinning layer 116.

A lower electrode 128 and an upper electrode 130 may be positioned near a bottom and a top of the memory element 100, respectively, in one approach. The lower electrode 128 and the upper electrode 130 may be constructed of a non-magnetic, electrically conductive material of a type known in the art, such as Au, Ag, Cu, Ta, etc., and may provide an electrical connection with a circuit 132. The circuit 132 may include a current source, and may further include circuitry for reading an electrical resistance across the memory element 100.

The magnetic free layer 106 has an effective magnetic anisotropy field (Hk_eff) that causes the magnetization 112 of the free layer 106 to remain stable in one of two directions perpendicular to the horizontal plane of the free layer 106. In a write mode of use for the memory element 100, the orientation of the magnetization 112 of the free layer 106 may be switched between these two directions by applying an electrical current through the memory element 100 via the circuit 132. A current in a first direction causes the magnetization 112 of the free layer 106 of the memory element 100 to flip to a first orientation, and a current in a second direction opposite to the first direction causes the magnetization 112 of the free layer 106 of the memory element 100 to flip to a second, opposite direction.

For example, if the magnetization 112 is initially oriented in an upward direction in FIG. 1, applying a current in a downward direction through the memory element 100 causes electrons to flow in an opposite direction upward through the memory element 100. Electrons travelling through the reference layer 104 become spin polarized as a result of the magnetization 110 of the reference layer 104. These spin-polarized electrons cause a spin torque on the magnetization 112 of the free layer 106, which causes the magnetization 112 to flip directions, from the upward direction to a downward direction.

On the other hand, if the magnetization 112 of the free layer 106 is initially in a downward direction in FIG. 1, applying an electrical current through the memory element 100 in an upward direction in FIG. 1 causes electrons to flow in an opposite direction, downward through the memory element 100. However, because the magnetization 112 of the free layer 106 is opposite to the magnetization 110 of the reference layer 104, the electrons will not be able to pass through the barrier layer 108. As a result, the electrons (which have been spin polarized by the magnetization 112 of the free layer 106) will accumulate at the junction between the free layer 106 and the barrier layer 108. This accumulation of spin polarized electrons causes a spin torque that causes the magnetization 112 of the free layer 106 to flip from the downward direction to an upward direction.

Data retention is an important performance parameter for a non-volatile memory such as Magnetic Random Access Memory. "Retention" refers to the ability of a data memory device to maintain recorded data over time in a variety of environments (such as temperature) without loss of data. In a Magnetic Random Access Memory device, such as that described above, the retention of the device correlates to the ability of the magnetization of the magnetic free layer 106 to remain in its recorded state after writing has been performed. The ability of the magnetic free layer to keep its recorded magnetization state is directly related to the perpendicular magnetic anisotropy of the magnetic free layer 106. Of particular importance is the Interface Perpendicular Magnetic Anisotropy (IPMA) which arises from the interfaces which the magnetic free layer 106 shares with the adjacent layers.

Another important parameter to the performance of a magnetic memory element such as the above described perpendicular magnetic tunnel junction (pMTJ) memory element 100 is the resistance area product (RA) of the device. As will be recalled, the memory state of the memory element is read by reading a difference in electrical resistance between a high resistance state and a low resistance state, and the difference in the electrical resistance between these states is a result of electron spin dependent TMR effect. The main contribution to RA of the device is due to the electrically insulating barrier layer 108. Any additional electrical resistance of the pMTJ device that is not arising from a barrier layer 108 is not desired since it can increase RA of a device which further raises the electrical current flowing through the MTJ element. This can damage the MTJ element by breaking the thin insulating barrier layer 108 if the current flowing through it is too high. As a result, increase in RA not related to barrier layer 108 can make reading the data more difficult and less reliable, leading to loss of data and reduced performance.

Therefore, two factors affect the performance of a magnetic memory element such as the memory element 100. The first factor is the perpendicular magnetic anisotropy of free layer 106 (and in particular the interfacial perpendicular magnetic anisotropy), which improves data retention by preventing the free layer from inadvertently switching memory states. The second factor is the resistance as this increases electrical current and makes the reading of data less reliable.

The present invention addresses both of these concerns. With continued reference to FIG. 1, a MgO capping layer 126 is formed on the magnetic free layer 106. A protective capping layer 127 can be provided over the MgO capping layer 126 to protect the underlying layers during manufacture from ambient environment. The protective capping layer 127 can be constructed of a material such as Ta and/or Ru.

The MgO capping layer 126 provides very good interfacial perpendicular anisotropy with regard to the free layer, especially when the thickness of the MgO capping layer is selected for optimal interfacial perpendicular magnetic anisotropy, approximately above 1 nanometer of MgO thickness. This advantageously improves data retention. However, MgO is generally an electrically resistive material, especially at the thicknesses required to achieve good interfacial perpendicular magnetic anisotropy. This would undesirably increase RA.

However, constructing the MgO capping layer by a novel process described herein below allows the MgO capping layer 126 to be formed with a unique structure such that the MgO has a low RA contribution, while also providing excellent interfacial perpendicular magnetic anisotropy.

Figure 2:
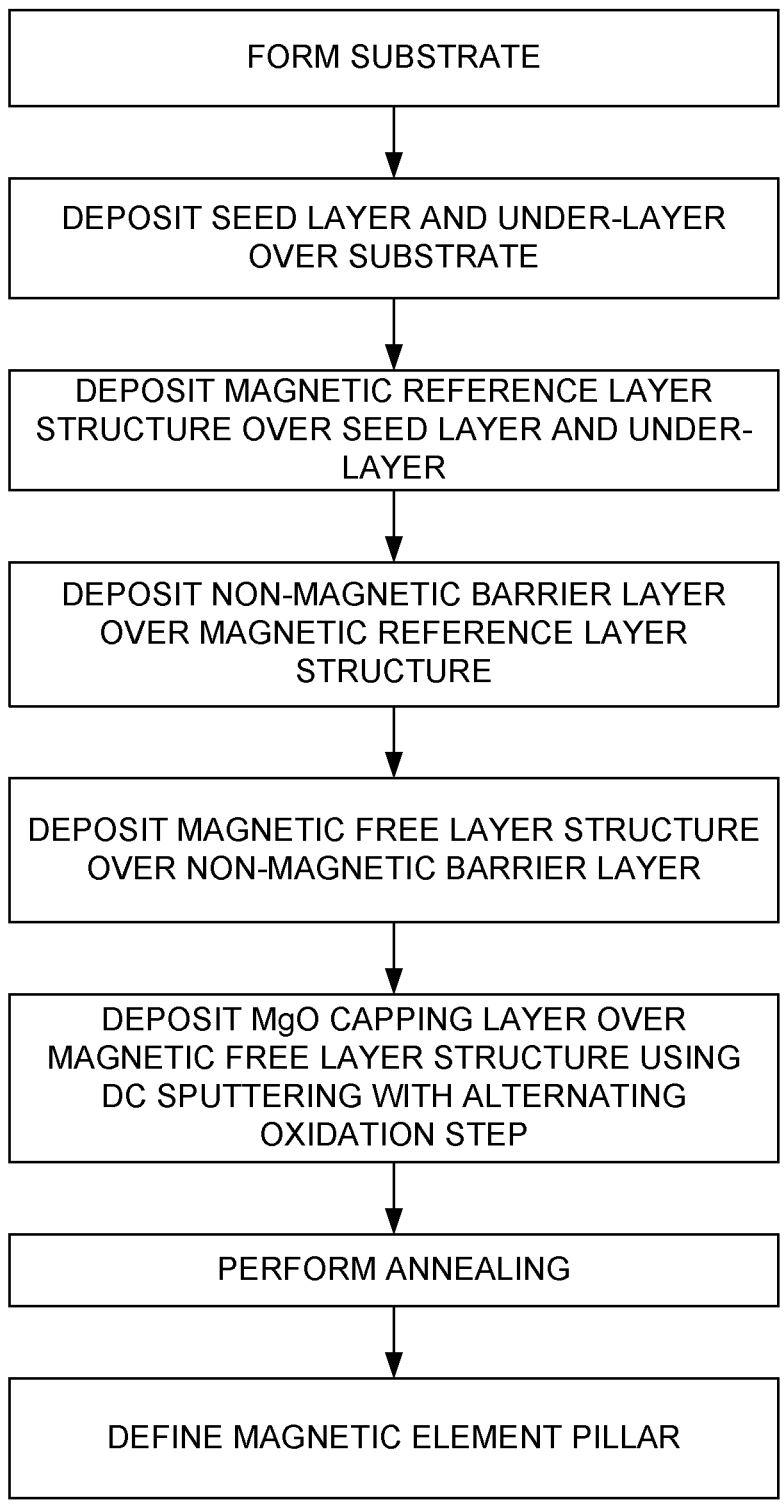
FIG. 2 is a flowchart illustrating a method for manufacturing a magnetic memory element having improved retention and low area resistance (RA)

The process for forming such a MgO capping layer 126 is described with reference to FIG. 2, which shows a flowchart illustrating a method 200 for manufacturing a magnetic memory element. In a step 202 a substrate is formed. The substrate can be formed on a wafer such as a Si wafer having circuitry such as CMOS circuitry embedded therein, and having electrodes formed on the substrate for connection with the CMOS circuitry. A seed layer and under-layer can be deposited over the substrate, such as in a sputter deposition chamber. The seed layer and under-layer are layers of material that are chosen to promote a desired texture in the above deposited layers. Then, in step 206, a magnetic reference layer structure is deposited over the seed layer and under-layer. The reference layer structure can be a synthetic anti-ferromagnetic structure that can include first and second layers of a magnetic material such as CoFeB and a layer non-magnetic antiferromagnetic coupling layer material such as Ru located between the first and second magnetic layers. Then, in a step 208 a thin non-magnetic barrier layer such as MgO is deposited over the reference layer structure. Then, in a step 210 a magnetic free layer structure is deposited over the non-magnetic barrier layer structure. The magnetic free layer can include one or more layers of CoFeB and a thin layer of W which can be at the top of the magnetic CoFeB layer or at some location within the magnetic CoFeB layer. Other different structures and compositions of the magnetic free layer are possible as well.

Then, in a step 212 MgO capping layer is deposited over the magnetic free layer. The MgO layer is formed by a process that minimizes the electrical resistivity of the MgO material, which allows the MgO layer to be formed to an optimal thickness for providing maximum interfacial perpendicular magnetic anisotropy, while adding minimal area resistance (RA) to the memory element which is negligible compared to the RA of the main barrier layer 108. To deposit the MgO capping layer, the wafer on which the memory element is being formed is placed into a sputter deposition chamber that includes Magnesium (Mg) target. Sputter deposition is performed using Direct Current (DC) power using Mg target rather than a more commonly used radio frequency sputtering method from Magnesium Oxide (MgO) target. The deposition is temporarily stopped while an Oxygen gas ($O_2$) is flown into the deposition chamber to cause an oxidation of the Mg layer previously deposited on the wafer. This process is repeatedly performed, alternating between DC sputtering and oxidation. This results in the formation of MgO multi-layer structure.

The process is continued until a desired MgO thickness is achieved. Preferably, the MgO layer 126 has a thickness of 0.5-3 nanometers to provide optimal interfacial perpendicular magnetic anisotropy. The capping layer 126 deposited by this process is an ultra-low RA MgO layer which provides exceptional interfacial perpendicular magnetic anisotropy for ensuring free layer magnetic retention. Several deposition parameters can be adjusted to achieve RA values of 1.5 $\Omega\mu^2$. These are: deposition time; oxygen flow rate; Mg layer thickness; and the number of Mg/oxide multi-layers. The above described process allows for the formation of a MgO capping layer that provides a desired interfacial perpendicular magnetic anisotropy (IPMA) field of free layer Hk=2 Ku/Ms of at least −15 kG for ensuring high free layer magnetic retention, while also ensuring a low RA of no greater than 1.5 $\Omega\mu m^2$.

After the desired MgO capping layer has been formed, an optional protective cap layer such as Ta or Ru can be deposited by standard sputter deposition techniques. Then, in a step 214 an annealing can be performed to set the proper texture and crystallization of the MTJ element. Then, in a step 216, a masking and ion milling process can be performed to form the above deposited layers into individual magnetic memory element pillars.

Figure 3:
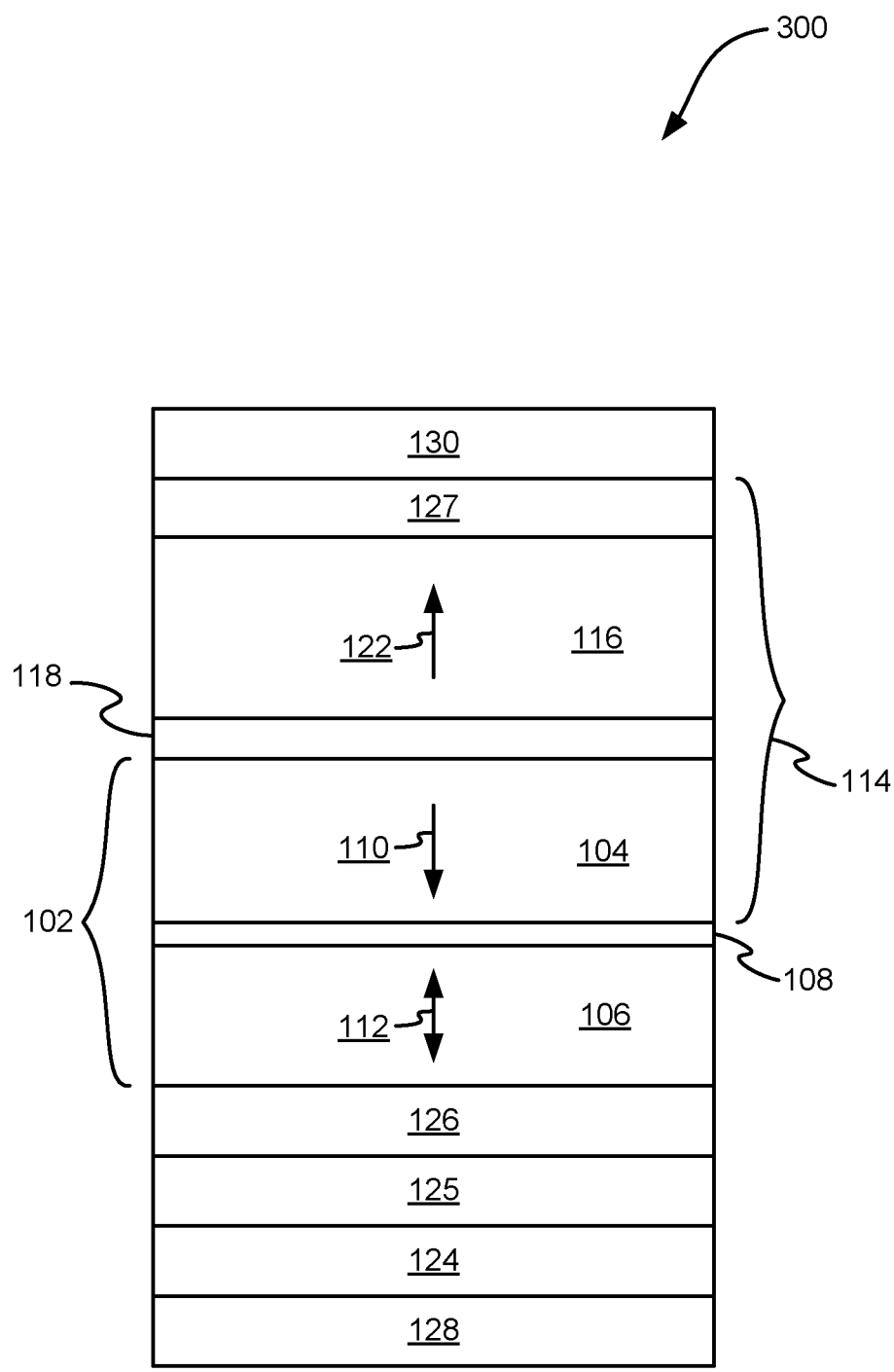
FIG. 3 is a schematic, cross-sectional view of a magnetic memory element according to another embodiment of the invention.

The above process described a structure and method for a magnetic memory element having high retention and low RA. With reference to FIG. 3, another embodiment is described wherein a similar MgO layer adjacent to a free layer structure provides increased retention with low RA. FIG. 3 shows a perpendicular magnetic tunnel junction element 300 that functions similarly to the memory element 100 described above with reference to FIG. 1. However, the memory element 300 had a free layer structure 106 that is located below the reference layer structure 104. The memory element 300 includes a bottom electrode 128, a seed layer 124 formed on the bottom electrode, and an under-layer 125 formed on the seed layer 124. A Mg—O layer 126 is formed over the under-layer 125, and a magnetic free layer 106 is formed directly on the Mg—O layer. In this case, the MgO layer 126 can be considered to be an under-layer itself. A thin non-magnetic barrier layer 108 such as Mg—O is formed over the magnetic free layer 106, and a magnetic reference layer 104 is formed over the non-magnetic barrier layer 108. The reference layer 104 can be part of a synthetic antiferromagnetic (SAF) structure 114 that includes: the magnetic reference layer (SAF1) 104; an antiferromagnetic exchange coupling layer such as Ru 118; and a second magnetic layer (SAF2) 116. A protective capping layer 127 such as Ta or Ru can be formed over the SAF structure 114, and an upper electrode 130 can be formed over the capping layer 130.

The MgO layer 126 is formed by the same deposition described above, in a sputter deposition chamber with a Mg target using a DC power, rather than RF sputter deposition using MgO target directly. The MgO layer is deposited by a series of alternating steps of (1) depositing Mg from the Mg target and (2) introducing oxygen into the chamber to oxidize the deposited Mg. This leads to a desired multi-layer MgO structure that has a low resistivity, resulting in a RA value of no greater than 1.5 $\Omega\mu m^2$, while also providing a beneficial interfacial perpendicular magnetic anisotropy to the magnetic free layer 106 for increased retention. Again, several parameters can be adjusted to achieve the desired RA value of no greater than 1.5 $\Omega\mu m^2$, those being: deposition time; oxygen flow rate; Mg layer thickness; and the number of multi-layers (e.g. number of Mg deposition/oxidation cycles).

While various embodiments have been described above, it should be understood that they have been presented by way of example only and not limitation. Other embodiments falling within the scope of the invention may also become apparent to those skilled in the art. Thus, the breadth and scope of the invention should not be limited by any of the above-described exemplary embodiments, but should be defined only in accordance with the following claims and their equivalents.

What is claimed is:

1. A magnetic random access memory element, comprising:
a magnetic reference layer;
a magnetic free layer;
a non-magnetic barrier layer disposed below the magnetic free layer and above the magnetic reference layer; and
a MgO layer contacting the magnetic free layer and being disposed adjacent the magnetic free layer, the magnetic free layer being formed between the non-magnetic barrier layer and the MgO layer, the MgO layer comprising multiple homogeneous layers of MgO and having an area resistance of less than 1.5 $\Omega\mu m^2$ and being negligible compared to an area resistance of the non-magnetic barrier layer.

2. The magnetic random access memory element of claim 1, wherein the MgO layer has a thickness of 0.5-3.0 nanometers.

3. The magnetic random access memory element of claim 2, wherein the MgO layer has a thickness of over 1 nanometer.

4. The magnetic random access memory element of claim 1, wherein the MgO layer is a capping layer over the magnetic free layer.

5. The magnetic random access memory element of claim 1, further comprising:
a protective capping layer contacting the MgO layer and disposed over the MgO layer.

6. The magnetic random access memory element of claim 1, wherein the non-magnetic barrier layer comprises MgO, and the magnetic free layer is disposed between the non-magnetic barrier layer and the MgO layer.

7. The magnetic random access memory element of claim 1, wherein the MgO layer provides an interfacial perpendicular magnetic anisotropy field of a free layer of at least −15 kGauss.

8. The magnetic random access memory element of claim 1, wherein the multiple homogeneous layers of MgO are formed through alternating DC sputtering and oxidation processes.

9. The magnetic random access memory element of claim 8, wherein the multiple homogeneous layers of MgO are formed through controlling one or more of the following parameters during the alternating DC sputtering and oxidation processes to maintain a thickness of the capping layer over 1 nanometer and an area resistance of less than 1.5 $\Omega\mu m^2$: deposition time, oxygen flow rate, Mg thickness, and the number of multi-layers.

10. A magnetic random access memory element, comprising:
a magnetic reference layer;
a magnetic free layer;
a non-magnetic barrier layer disposed below the magnetic reference layer and above the magnetic free layer; and
a MgO layer contacting the magnetic free layer and being disposed adjacent the magnetic free layer, the magnetic free layer being formed between the non-magnetic barrier layer and the MgO layer, the MgO layer comprising multiple homogeneous layers of MgO and having an area resistance of less than 1.5 $\Omega\mu m^2$ and being negligible compared to an area resistance of the non-magnetic barrier layer.

11. The magnetic random access memory element of claim 10, wherein the MgO layer has a thickness of 0.5-3.0 nanometers.

12. The magnetic random access memory element of claim 11, wherein the MgO layer has a thickness of over 1 nanometer.

13. The magnetic random access memory element of claim 10, wherein the MgO layer is formed over an under-layer, and the under-layer is formed over a seed layer.

14. The magnetic random access memory element of claim 10, wherein the non-magnetic barrier layer comprises MgO, and the magnetic free layer is disposed under the non-magnetic barrier layer and over the MgO layer.

15. The magnetic random access memory element of claim 10, wherein the MgO layer provides an interfacial perpendicular magnetic anisotropy field of a free layer of at least −15 kGauss.

16. The magnetic random access memory element of claim 10, wherein the multiple homogeneous layers of MgO are formed through alternating DC sputtering and oxidation processes.

17. The magnetic random access memory element of claim 16, wherein the multiple homogeneous layers of MgO are formed through controlling one or more of the following parameters during the alternating DC sputtering and oxidation processes to maintain a thickness of the capping layer over 1 nanometer and an area resistance of less than 1.5 $\Omega\mu m^2$: deposition time, oxygen flow rate, Mg thickness, and the number of multi-layers.

18. The magnetic random access memory element of claim 10, further comprising:
    an antiferromagnetic exchange coupling layer and a second magnetic layer disposed over the magnetic reference layer.

* * * * *